United States Patent [19]
Maue et al.

[11] Patent Number: 5,936,818
[45] Date of Patent: *Aug. 10, 1999

[54] INTERIOR TRIM PANEL AND ELECTRICAL HARNESS APPARATUS FOR AN AUTOMOTIVE VEHICLE

[75] Inventors: H. Winston Maue, Farmington Hills; Ronald K. Reich, Saline, both of Mich.; Robert G. Morgan, Bolton, Conn.; Timothy S. Roddy, Plymouth, Mich.

[73] Assignee: UT Automotive Dearborn, Inc., Dearborn, Mich.

[*] Notice: This patent is subject to a terminal disclaimer.

[21] Appl. No.: 08/980,643

[22] Filed: Dec. 1, 1997

Related U.S. Application Data

[63] Continuation-in-part of application No. 08/569,684, Dec. 8, 1995, Pat. No. 5,805,402.

[51] Int. Cl.⁶ .................................................. H02H 3/00
[52] U.S. Cl. .......................... 361/93; 361/115; 361/826
[58] Field of Search ............................. 361/93, 115, 826, 361/749, 752; 307/10.1

[56] References Cited

U.S. PATENT DOCUMENTS

| | | | |
|---|---|---|---|
| 4,603,894 | 8/1986 | Osenkowski | 292/216 |
| 4,766,697 | 8/1988 | Boileau | 49/352 |
| 4,785,585 | 11/1988 | Grier et al. | 49/502 |
| 4,797,508 | 1/1989 | Chant | 174/68.5 |
| 4,829,713 | 5/1989 | Bozyk et al. | 49/506 |
| 4,850,636 | 7/1989 | McLaren et al. | 296/146 |
| 4,862,011 | 8/1989 | Wright | 307/10.1 |
| 4,882,842 | 11/1989 | Basson et al. | 29/857 |
| 4,883,974 | 11/1989 | Tinder | 307/10.1 |
| 4,890,376 | 1/1990 | Boileau | 29/434 |
| 4,941,258 | 7/1990 | Wright | 29/858 |
| 4,943,109 | 7/1990 | Skrbina et al. | 296/146 |
| 5,095,659 | 3/1992 | Benoit et al. | 49/502 |
| 5,174,066 | 12/1992 | Dupuy | 49/502 |
| 5,226,259 | 7/1993 | Yamagata et al. | 49/502 |
| 5,251,403 | 10/1993 | Compeau et al. | 49/502 |
| 5,308,129 | 5/1994 | Hlavaty | 296/216 |
| 5,308,138 | 5/1994 | Hlavaty | 296/146.6 |
| 5,324,203 | 6/1994 | Sano et al. | 439/34 |
| 5,351,443 | 10/1994 | Kimura et al. | 49/502 |
| 5,355,629 | 10/1994 | Kimura et al. | 49/502 |
| 5,367,832 | 11/1994 | Compeau et al. | 49/502 |
| 5,425,206 | 6/1995 | Compeau et al. | 49/502 |
| 5,469,664 | 11/1995 | Staser et al. | 49/452 |
| 5,484,186 | 1/1996 | Van Order et al. | 296/97.5 |
| 5,535,553 | 7/1996 | Staser et al. | 49/502 |
| 5,537,781 | 7/1996 | Bisnack et al. | 49/351 |
| 5,548,488 | 8/1996 | Hansen | 361/815 |
| 5,625,981 | 5/1997 | Klein et al. | 49/227 |
| 5,647,171 | 7/1997 | Wirsing et al. | 49/502 |
| 5,805,402 | 9/1998 | Mave et al. | 361/93 |

OTHER PUBLICATIONS

"Mitsui–Pathtek Process Type In–Mold Circuit Definition (Two–Shot)" brochure, 2 pages, Prior to Dec. 1, 1997.

Mitsui–Pathtek Brochure entitled "Inevitable Technology", 12 pages, prior to Dec. 1, 1997.

"Introduction to Molded Interconnect Devices", prior to Dec. 1, 1997.

Chilton's Product Design and Development news magazine entitled "Molding Many Parts Into One", Dec. 1995, 4 pages.

Primary Examiner—Jeffrey Gaffin
Assistant Examiner—Stephen Jackson
Attorney, Agent, or Firm—Harness, Dickley & Pierce, P.L.C.

[57] ABSTRACT

The preferred embodiment apparatus employs an interior trim panel and an electrical harness for use in an automotive vehicle. In one aspect of the present invention, the interior trim panel has a generally rigid substrate covered by an aesthetically pleasing covering material. In another aspect of the present invention, an electrical harness is provided with integrally created switch contacts and integrally created connector terminals.

26 Claims, 4 Drawing Sheets

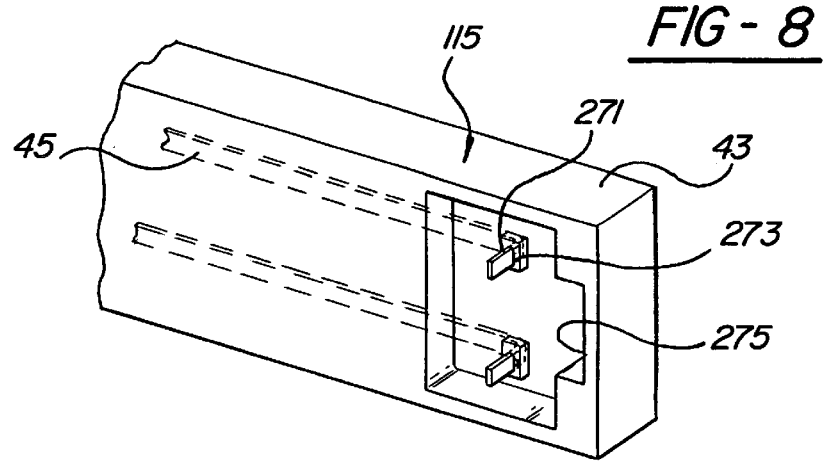
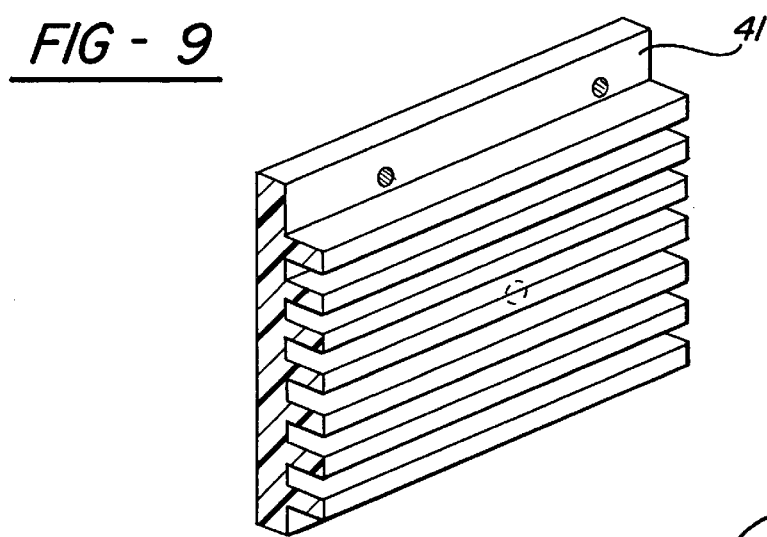
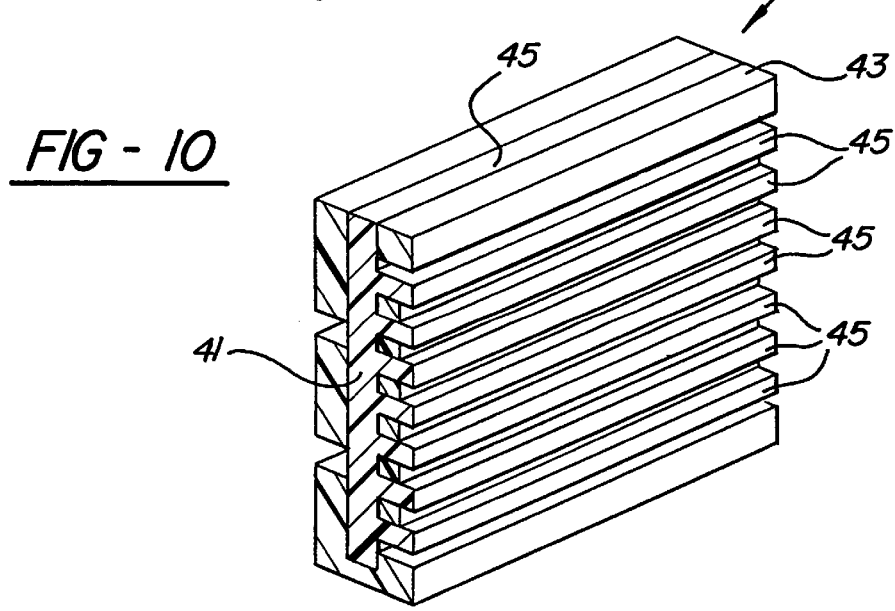

INTERIOR TRIM PANEL AND ELECTRICAL HARNESS APPARATUS FOR AN AUTOMOTIVE VEHICLE

CROSS-REFERENCE TO RELATED APPLICATIONS

This application is a continuation-in-part of U.S. patent application Ser. No. 08/569,684, filed on Dec. 8, 1995, now U.S. Pat. No. 5,805,402 which is incorporated by reference herewithin.

BACKGROUND OF THE INVENTION

This invention relates generally to electrical systems within automotive vehicles and specifically to an automotive vehicle interior trim panel and an electrical harness.

It is common to employ wire harnesses for automotive vehicles which have to be individually tailored for particular vehicle options. Conventional wire harnesses employ many discretely insulated copper wires that are wrapped together by tape. Many separate connector terminals and connector housings are fastened to the discrete wires. This arrangement is sometimes prone to rattling when the vehicle is moving and snagging by adjacent parts during installation. Traditional wire harnesses are extremely complex, requiring labor intensive and costly splicing. Such wire harnesses are mounted to vehicle body instrument panels, door panels, floor panels, roof panels, in the engine compartment and in the trunk.

It is also known to provide a two shot injection molded blower switch in an automotive vehicle which has integrally molded male blades formed with rotary switch contacts and a bulb socket. The electrically conductive areas are plated with a conductive metallic material. This part is rigid in all directions and does not incorporate an electrical harness.

Recently, a trend has developed toward modularization of automotive vehicle door and headliner components. For doors, the majority of this modularization has occurred for the door hardware (i.e., mechanical components such as door locks, window lift regulators and the like) and various structural cassettes for mounting to the sheet metal door reinforcement. Examples of such conventional modular vehicle doors are disclosed in the following U.S. Pat. Nos.: U.S. Pat. No. 5,425,206 entitled "Tubular Plastic Mounting Panel for Door Hardware" which issued to Compeau et al. on Jun. 20, 1995; U.S. Pat. No. 5,355,629 entitled "Door Structure for Vehicle" which issued to Kimura et al. on Oct. 18, 1994; U.S. Pat. No. 5,174,066 entitled "Door Glass Cassette for Vehicles" which issued to Dupuy on Dec. 29, 1992; U.S. Pat. No. 5,095,659 entitled "Automobile Door Modular Assembly" which issued to Benoit et al. on Mar. 17, 1992; U.S. Pat. No. 4,943,109 entitled "Automotive Door Assembly having a Plug-In Electrified Interior Panel" which issued to Skrbina et al. on Jul. 24, 1990; U.S. Pat. No. 4,785,585 entitled "Vehicle Door With Separable Door Hardware Module" which issued to Grier et al. on Nov. 22, 1988; and U.S. Pat. No. 4,603,894 entitled "Lock and Handle Module for Vehicle Door" which issued to Osenkowski on Aug. 5, 1986. All of these patents are incorporated by reference herewithin.

As can be observed in the aforementioned patents, modularization of the electrical and wiring aspects of the automotive vehicle doors has been generally overlooked. Furthermore, due to the traditional design, engineering and manufacturing separation between conventional electrical and interior trim disciplines within the automotive industry, integration therebetween has not significantly evolved.

Notwithstanding, it is worth noting U.S. Pat. No. 5,324,203 entitled "Electrical Harnessing Structure for Vehicle" which issued to Sano et al. on Jun. 28, 1994. This patent discloses the use of a flat cable, flexible printed circuit boards and their separate electrical connections behind an instrument panel and door trim panel. However, there is no discussion of a polymeric circuit portion, nor integrally formed connectors or switch contacts. Accordingly, it would be desirable to modularize the electrical harness and trim panel functions and products to achieve the long sought after benefits of true synergistic integration. It would also be desirable to modularize the electrical harness, switch and connector functions.

SUMMARY OF THE INVENTION

In accordance with the present invention, the preferred embodiment apparatus employs an interior trim panel and an electrical harness for use in an automotive vehicle. In one aspect of the present invention, the interior trim panel has a generally rigid substrate covered by an aesthetically pleasing covering material. In another aspect of the present invention, an electrical harness employs molded polymeric members that define electrically conductive circuits which conduct electricity between at least one switch and at least one electricity activated device. In yet another aspect of the present invention, an electrical harness is provided with integrally created switch contacts and integrally created connector terminals as a single piece modularized unit. In still another aspect of the present invention, a sheet-like electrically conductive layer is employed as an integrated electrical harness and switch. Furthermore, in another aspect of the present invention interior trim and electrical apparatus, an electrical harness is integrally formed and affixed within an interior trim panel.

The interior trim panel and electrical harness apparatus of the present invention is highly advantageous over conventional constructions since the present invention allows one part to serve many functions in a truly synergistic manner. For example, the electrical harness of the present invention employs continuous branched circuits in place of conventional spliced wires, or discretely wired pigtails and electrical connectors. The present invention also forms the switch contacts and/or electrical connectors as part of the conductive harness as a single piece formed member. Hence, bulky and costly separate metal and plastic electrical connectors, crimps and splices are reduced. Moreover, the circuits can make sharply angled bends and can closely conform to three dimensional contours.

Furthermore, use of the present invention electrical apparatus with an interior trim panel, such as for a door, instrument panel, headliner or the like, serves to reduce the number and size of traditionally cumbersome wire harnesses within the tightly packaged door while also allowing for integration of connector terminals. The present invention is further advantageous by preassembling the electrical harness to the interior trim panel substrate, off-line, prior to the trim panel's installation on a quickly moving final assembly line. Thus, easy electrical continuity inspections can be performed prior to final assembly so as to prevent potentially destructive disassembly from the sheet metal if problems are later detected. Moreover, the interior trim panel can be positioned for convenient and easily visible electrical preassembly without requiring the conventional repeated installer ingress and egress of the moving vehicle (which often has exposed sharp metal edges) for applying conventional wire harnesses onto doors or onto bulkheads behind instruments panels.

Additionally, the electrical harness can be formed within the interior trim panel in a single step molding operation thereby further reducing fastener and switch housing parts. Therefore, the present invention integrated assembly reduces parts, cost, installation time, installation effort, electrical fasteners, wire counts, wire pinching, weight, wire harness thickness and big bend radii in critically tight areas, as well as part tolerance stack-ups, while also improving the overall interior trim and electrical part quality and performance. Additional advantages and features of the present invention will become apparent from the following description and appended claims, taken in conjunction with the accompanying drawings.

BRIEF DESCRIPTION OF THE DRAWINGS

FIG. 8 is a fragmentary perspective view, taken within circle 8 of FIG. 1, showing an electrical connector segment of the preferred embodiment electrical harness;

FIG. 9 is a fragmentary perspective view showing a first processing step for the preferred embodiment electrical harness; and FIG. 10 is a fragmentary perspective view showing a second processing step for the preferred embodiment electrical harness.

DETAILED DESCRIPTION OF THE PREFERRED EMBODIMENT

Figure 1:
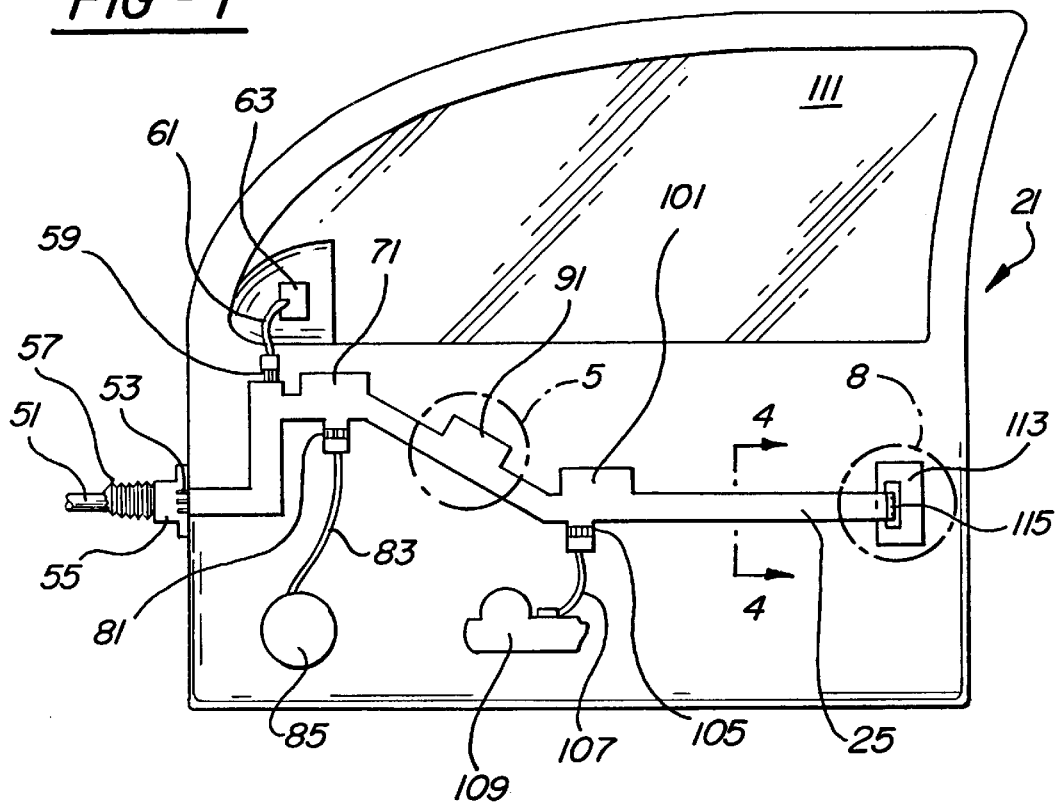
FIG. 1 is a diagrammatic side elevational view, as observed from outside of an automotive vehicle, showing a left-hand driver door assembly employing a preferred embodiment of an interior trim panel and electrical harness apparatus of the present invention.
Figure 2:
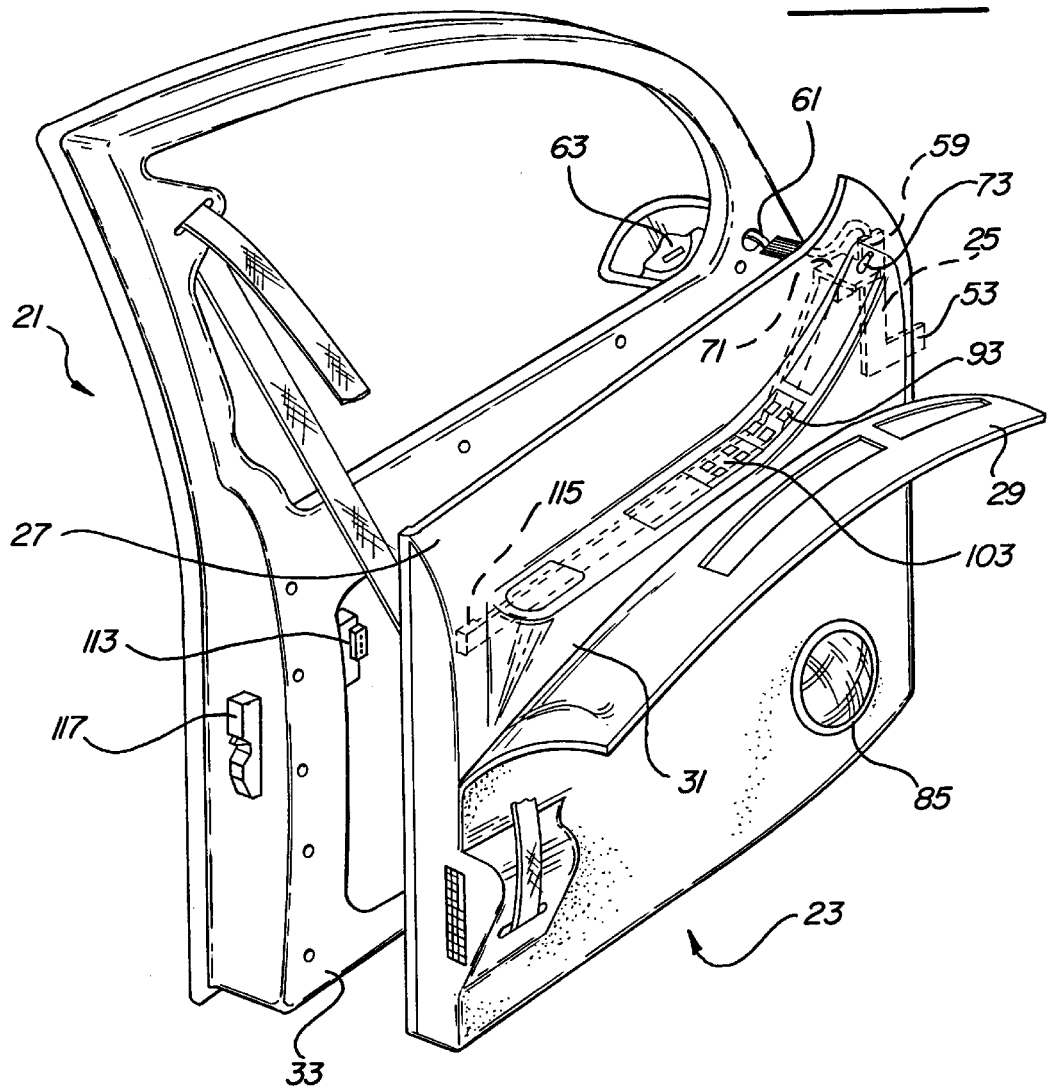
FIG. 2 is a partially exploded perspective view, as observed from inside of the automotive vehicle, showing the left-hand driver door assembly employing the preferred embodiment interior trim panel and electrical harness apparatus.
Figure 3:
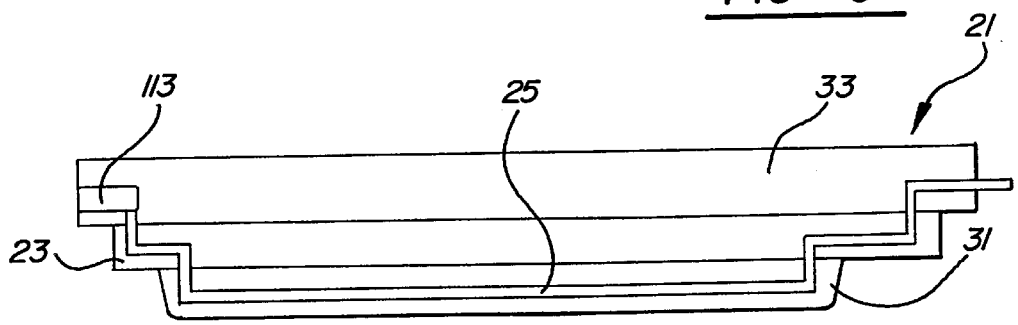
FIG. 3 is a diagrammatic top elevational view showing the left-hand door assembly employing the preferred embodiment interior trim panel and electrical harness apparatus.

As can best be observed in FIGS. 1–3, the apparatus of the present invention preferably employs a door assembly 21 which includes an interior trim door panel 23 and an electrical harness 25. Door trim panel 23 has a generally rigid substrate 27, relatively soft foam inserts (not shown) and an aesthetically pleasing vinyl or fabric covering material 29 (shown in a partially peeled back orientation in FIG. 2). Substrate 27 can be injection molded from a polymeric material such as polypropylene or ABS, or is reaction injection molded from a glass fiber-filled polyether amine and isocynate mixture. Furthermore, substrate 27 provides for either a separately applied armrest 31 or preferably one which can be integrally formed with the generally flat portion of door trim panel 23. The reaction injection molded door trim panel 23 can be made in accordance with the following U.S. Pat. Nos.: U.S. Pat. No. 5,411,688 which issued to Morrison et al. on May 2, 1995; U.S. Pat. No. 5,340,425 which issued to Strapazzini on Aug. 23, 1994; and U.S. Pat. No. 5,091,031 which issued to Strapazzini on Feb. 25, 1992, all of which are entitled "Method for Forming Plastic Molded Panels with Inserts;" these references are all incorporated by reference herewithin. However, a more conventional variety of door trim panel 23 may also be made in accordance with U.S. Pat. No. 5,173,228 entitled "Method for Forming a 360 Degree Skin Handle" which issued to Kargarzadeh et al. on Dec. 22, 1992 or U.S. Pat. No. 4,226,464 entitled "Arm Rest Shaped to Include a Through Grip or Hand Grip with Hollow Molded Body" which issued to Janz et al. on Oct. 7, 1980, the disclosures of which are incorporated by reference herewithin. Substrate 27 is fastened to a sheet metal door reinforcement panel 33 through barbed, plastic Christmas tree fasteners or the like.

Figure 4:
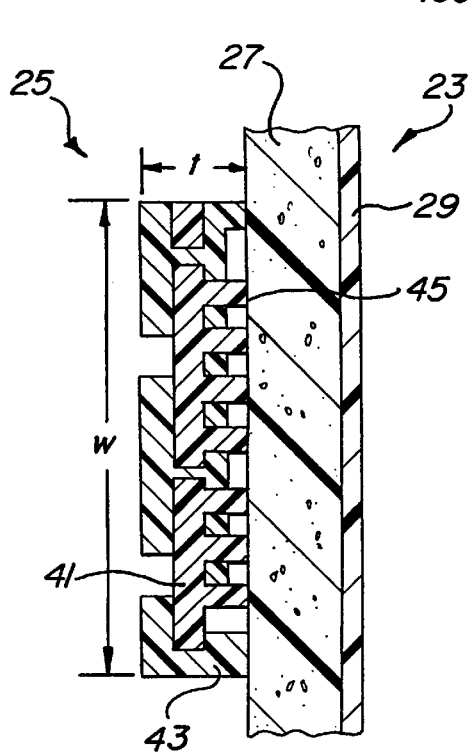
FIG. 4 is a fragmentary cross sectional view, taken along line 4—4 of FIG. 1, showing the preferred embodiment interior trim panel and electrical harness apparatus.

Referring to FIGS. 4, 9 and 10, electrical harness 25 is made by injection molding a catalytic platable polymeric resin 41 in a first injection mold (as shown in FIG. 9). Next, a second shot of a non-catalytic polymeric resin 43 is injection molded over portions of the catalytic platable polymeric resin 41 (as is shown in FIG. 10) in a second mold. The surfaces of catalytic platable polymeric resin 41 which remain exposed after overmolding of non-catalytic polymeric resin 43 define multiple circuits 45. An adhesion promoter is applied to these exposed circuit areas and then these exposed surfaces are plated with an electroless copper which is attracted to the catalyst in catalytic platable polymeric resin 41. The polymeric resins are preferably selected from those having a relatively high heat deflection temperature. Furthermore, the copper is plated between 0.0005 and 0.002 inch thick. Non-catalytic polymeric resin 43 acts as an insulator while the raised and plated portions of catalytic platable polymeric resin 41 act as electricity carrying, conductive circuits or traces 45. Such a two-shot part can be purchased from Molded Interconnect Devices of Rochester, N.Y.

Alternately, catalytic polymeric resin 41 can be replaced by spatially separated electrically conductive polymeric members that do not require plating. It is also alternately envisioned that a photo imaging process can be employed to make an electrical harness wherein an injection molded substrate is formed in a platable grade of thermoplastic resin. Next, the part surface is chemically prepared to accept electroless plating. A thin layer of electroless copper is then deposited on the entire surface. A photo sensitive polymer resist is then applied over the entire part, whereafter the part is exposed to ultraviolet light to harden the resist. The unexposed resist is then chemically removed, and copper and other metallic alloys are electroplated. Finally, the resist is removed from the unplated areas and the background copper is etched.

The routing of electrical harness 25 is illustrated in FIGS. 1–4. In the preferred embodiment, a body wire harness 51 is electrically connected to a first door electrical connector 53 by way of a body harness connector 55 and an articulating accordion-style tube 57. Connector 55 is bolted to either a front edge of door reinforcement panel 33 or to door electrical connector 53. An exterior mirror electrical connector segment 59 is also integrally formed as part of electrical harness 25 for mating with a flexible wire pigtail and associated connector 61. Pigtail and connector 61 are electrically connected to a power pack having one or more electric motors 63 for moving the exterior mirror. Switch circuit contacts are contained within switching segment of electrical harness corresponding with each operator accessible switch. The switch circuit contacts are integrally created with and electrically connected to the conductive traces or circuits without an intervening, discontinuous and dissimilar circuit layer therebetween. Exterior mirror switch contacts 71 are integrally formed as part of electrical harness 25. A joystick or four-way switching contact 73 interfaces with exterior mirror switch contact 71 thereby defining a switch assembly.

A speaker electrical connector segment 81 is integrally formed as part of electrical harness 25 and is coupled to a flexible wire pigtail and associated connector 83 for supplying electrical current to a door mounted speaker assembly 85. Speaker assembly 85 includes an electromagnet. Four door lock switch contact segments 91 are integrally formed as part of electrical harness 25 and are selectively energized by corresponding rocker or sliding switch buttons and movable contacts 93 thereby defining a door lock switch assembly.

Four window switch contact segments 101 (for a four door vehicle) are also integrally formed as part of electrical harness 25 and interface with switch buttons and movable contacts 103 to define a window switch assembly. An integrally formed window lift electrical connector 105 is made as part of electrical harness 25. Connector 105 mates with a corresponding pigtail and electrical connector 107 which supply current to a fractional horsepower, direct current electric motor 109. When energized, electric motor 109 rotates an armature by electromagnetic forces thereby raising and lowering a door window 111 by way of a scissor arm, rack and pinion, cable drive or other window lift mechanism.

An electromagnetic solenoid or motor 113 is electrically connected directly to a door lock electrical connector 115 integrally formed as part of electrical harness 25. Solenoid or motor 113 serves to operably lock and unlock a door lock mechanism 117 mounted to a rear edge of door reinforcement panel 33. It should be appreciated that all of the pigtail, as well as separate plastic and metal electrical connectors, can be replaced by integrally formed electrical connectors, and vice versa.

Electrical harness 25 spans between the electrical connectors and switches in a longitudinally elongated manner. Electrical harness 25 further is formed to have sharp cornered angles and various steps in three dimensions so as to be easily packaged around electrical accessories and mechanical accessories mounted to the door. Depending on the material thicknesses employed, electrical harness 25 is somewhat flexible about its thickness dimension t and is relatively more rigid about its greater width dimension w, prior to installation to either door reinforcement panel 33 or to door trim panel 23.

Electrical harness 25 is preferably mounted to the backside of substrate 27 of door trim panel 23 by insert molding a flange or other portion of insulating polymeric member 43 within the reaction injection molded substrate 27. Alternately, insulating polymeric member 43 can be screwed, glued or snapped onto substrate 27, especially if an injection or compression molded substrate is employed. At least the majority of the plated circuits 45 are mounted to face against the non-conductive substrate 27 and away from contact with any sheet metal surfaces.

Figure 7:
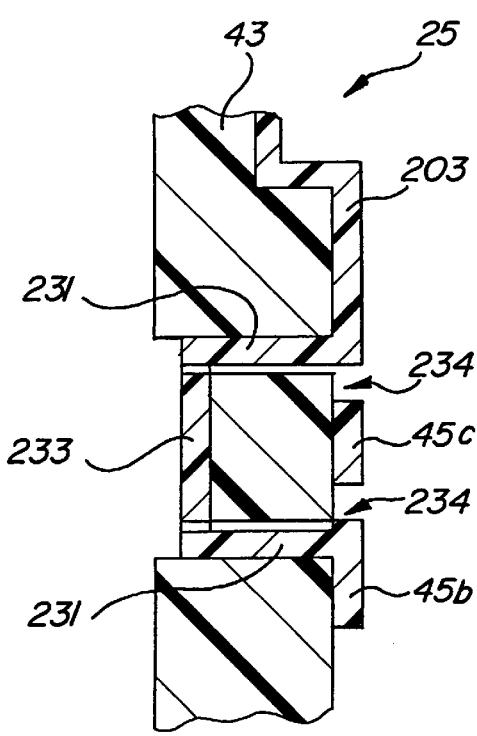
FIG. 7 is a fragmentary cross sectional view, taken along line 7—7 of FIG. 5, showing the preferred embodiment electrical harness.
Figure 5:
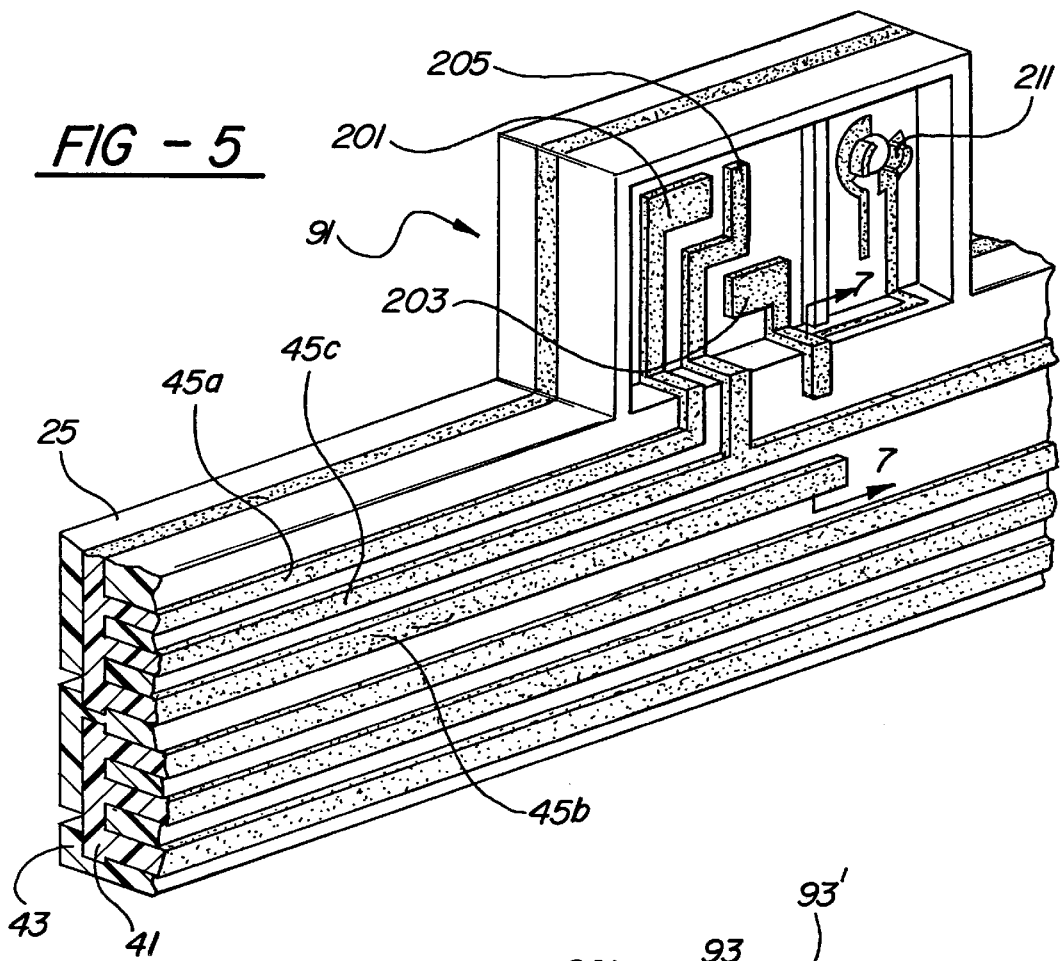
FIG. 5 is a fragmentary perspective view, taken within circle 5 of FIG. 1 but observed in the direction of FIG. 2, showing the preferred embodiment electrical harness.
Figure 6:
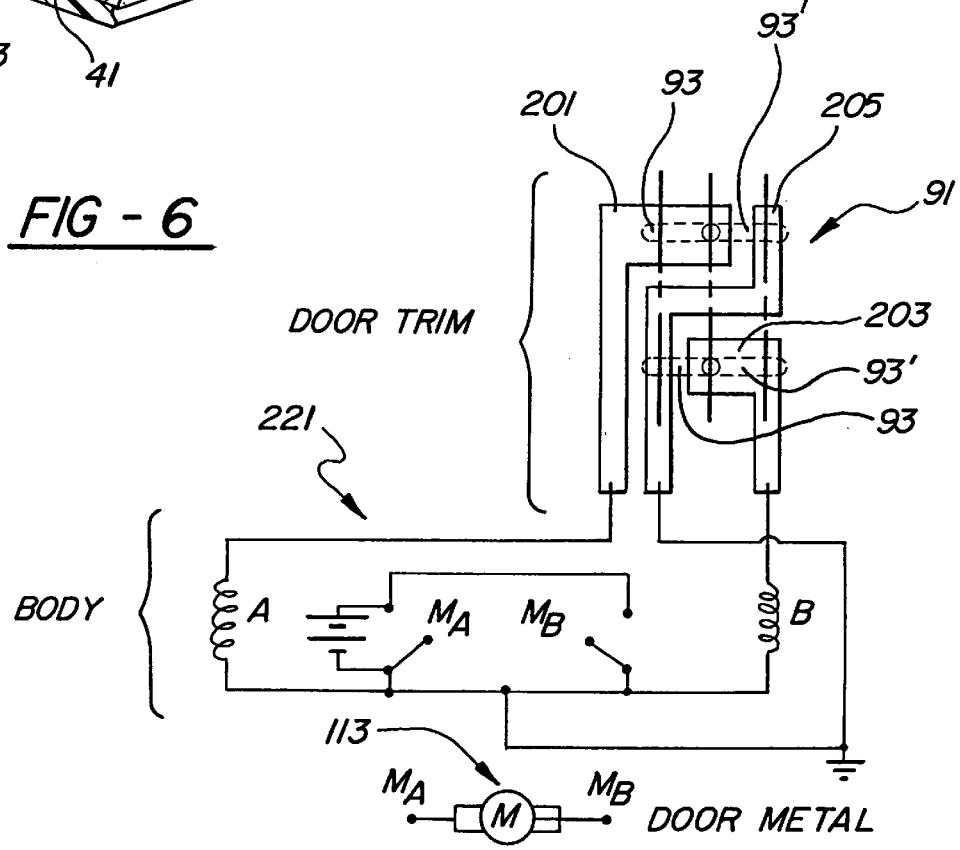
FIG. 6 is a diagrammatic and schematic view showing a switch segment and electrical circuit of the preferred embodiment electrical harness.

FIGS. 5–7 show an exemplary electrical switch assembly, specifically the door lock switch assembly. Switch contacts 93 consist of a first inverted L-shaped hot circuit portion 201, an oppositely facing and inverted L-shaped hot circuit portion 203 and an intermediate zig zag or Z-shaped ground circuit portion 205. Circuit portions 201–205 are integrally formed as a single piece and in an unbroken, continuous manner with circuits 45a, 45b and 45c, respectively. Circuit 45c serves as a common ground circuit for multiple electrical switches and branches off at each switch and for various electrical connectors. Integrally formed circuits also selectively energize a light bulb socket 211. Switch button and movable contacts 93 are movable between three positions, lock, unlock and deenergized. The locked and unlocked energization positions serve to activate an H-bridge relay 221 located in the vehicle body, such as behind an instrument panel, which is coupled to solenoid or motor 113 mounted to the door metal reinforcement panel. It is also noteworthy that insulating polymeric material 43 provides a portion of a switch housing 212.

Circuits 45 are able to cross over one another as is shown in FIG. 7. Stepped pass through circuit portions 231 connect a transversely oriented bridge portion 233 to connect circuit portion 203 and the normally longitudinally elongated main portion of circuit 45b. Localized bores 234 are provided adjacent to pass through circuit portions 231 in order to allow these areas to become plated, and thereby conductive. The backside of bridge 233 is free of insulating polymeric member 43 and is also thereby plated and conductive.

Door lock electrical connector 115 is shown in greater detail in FIG. 8. A set of male blades or terminals 271 project beyond the backside of insulating polymeric material 43 and are plated so as to conduct electricity. Localized bores 273 are disposed adjacent and parallel to each blade 271 so as to thereby fully allow plating of a side of each blade. Each blade 271 is integrally molded as a single piece with the corresponding circuit 45 thereby dispensing with the conventionally extraneous crimped on, stamped metal terminals and extra plastic connectors. A locking structure 275 is also provided within insulating polymeric material 43. Male blades 271 can be in-line with the elongated routing of circuits 45 or they can be generally perpendicular thereto, as is shown in FIG. 8. Female terminals or receptacles can also be substituted in place of the disclosed male blades 271.

An alternate embodiment of an interior trim and electrical of the present invention includes an interior trim instrument panel. The instrument panel has an injection molded or reaction injection molded substrate and an aesthetically pleasing vinyl covering material with a reaction injection molded foam injected therebetween, wherein reference number 23 in FIG. 4 would designate the instrument panel. It is important to distinguish the instrument panel supporting and structural substrate from a nonstructural injection molded instrument cluster assembly (not shown) which retains a variety of tightly packed instruments and lights. A metal reinforcing bar or brace extends in a crosscar manner for supporting and fastening the instrument panel to the automotive vehicle body.

The electrical apparatus is directly screwed upon the backside of the substrate and is constructed in accordance with the teachings of the preferred embodiment. Various circuits of the electrical apparatus are incorporated into at least one switch as was disclosed with the preceding embodiment. The specific switch construction employs a bezel retaining a switch housing portion of the electrical apparatus. FIG. 4 equally illustrates a section through a headliner but would be oriented horizontally rather than vertically.

Various materials have been disclosed in an exemplary fashion, however, other materials may of course be employed. It is intended by the following claims to cover these and any other departures from the disclosed embodiments which fall within the true spirit of this invention.

The invention claimed is:

1. An apparatus for use in an automotive vehicle, said apparatus comprising an elongated electrical harness having a first insulating polymeric portion and at least a second polymeric portion, said second polymeric portion defining multiple electrically conductive circuits, said circuits being at least partially separated by said first insulating polymeric portion.

2. The apparatus of claim 1 further comprising at least two electric motors and at least two switches, at least seven of said circuits integrally formed as part of said electrical harness selectively conducting electricity between said at least two switches and said at least two electric motors.

3. The apparatus of claim 1 further comprising at least one sharply angled step located in said first and second polymeric portions.

4. The apparatus of claim 1 further comprising at least a first of said circuits crossing over a second of said circuits in a transversely offset manner with said first insulating polymeric portion disposed between said circuits.

5. The apparatus of claim 1 further comprising at least two electrical switches integrally formed as part of said electrical harness, said electrical harness being elongated between said switches.

6. The apparatus of claim 1 further comprising a first connector including a set of male connector blades located adjacent to a first end of said electrical harness, a second connector located adjacent to a second end of said electrical harness, said connectors being integrally formed as part of said polymeric portions.

7. The apparatus of claim 1 further comprising an interior trim panel of said automotive vehicle, said electrical harness being mounted to said interior trim panel.

8. The apparatus of claim 1 wherein said second polymeric portion is plated with a conductive metallic material.

9. The apparatus of claim 1 wherein said second polymeric portion is made from a conductive polymeric resin.

10. The apparatus of claim 1 further comprising a switch integrally created as part of said electrical harness, contacts of said switch defined as sections of said second polymeric portion.

11. The apparatus of claim 2 wherein a section of said first insulating polymeric member defines at least a segment of a protective housing for said switch.

12. The apparatus of claim 2 wherein said switch protrudes substantially transversely from an elongated direction of said electrical harness.

13. An apparatus for use in an automotive vehicle, said apparatus comprising:
   a rigid panel of said automotive vehicle;
   an actuating device having an internal component movable in response to an electromagnetic field;
   a switch device, at least one of said devices mounted to said panel; and
   an electrical harness mounted to said panel, said electrical harness having an insulating portion and conductive circuits, said circuits operably conducting electricity to said devices, at least one of said circuits integrally branching into multiple sub-circuits;
   said electrical harness having a thickness smaller than a transverse width, said electrical harness being substantially flexible in a first direction and comparatively rigid in a perpendicular second direction prior to mounting said electrical harness to said panel.

14. The apparatus of claim 13 wherein said panel is a door trim panel.

15. The apparatus of claim 13 wherein said panel includes a reaction injection molded substrate and an aesthetic covering material, at least a portion of said electrical harness integrally molded within said substrate thereby retaining said electrical harness to said panel.

16. The apparatus of claim 13 further comprising a second electrical switch device and an electrical connector integrally created as part of said electrical harness.

17. The apparatus of claim 13 wherein said actuating device is a door lock actuating electromagnetic device.

18. An apparatus for use in an automotive vehicle, said apparatus comprising:
   a substantially rigid panel of said automotive vehicle;
   a switch;
   an elongated electrical harness mounted to said panel, said electrical harness having a first polymeric insulating portion and conductive circuits formed at least in part by a second polymeric portion, said circuits operably conducting electricity to said switch, at least one of said circuits integrally branching into multiple sub-circuits; and
   contacts of said switch defined as sections of at least said second polymeric portion, said switch being integrally created as part of said electrical harness.

19. The apparatus of claim 18 wherein a section of said first insulating polymeric portion defines at least a segment of a protective housing for said switch.

20. The apparatus of claim 18 wherein said switch protrudes substantially transversely from an elongated direction of said electrical harness.

21. The apparatus of claim 18 further comprising at least one sharply angled step located in said first and second polymeric portions.

22. The apparatus of claim 18 further comprising at least a first of said circuits crossing over a second of said circuits in a transversely offset manner with said first insulating polymeric portion disposed between said circuits.

23. The apparatus of claim 18 wherein said substantially rigid panel is an interior trim panel of said automotive vehicle, said electrical harness is mounted to said interior trim panel.

24. An elongated electrical harness for use in an automotive vehicle having at least two distinctly separated electrical switches and a power source, said electrical harness being made according to the process comprising the steps of:
   (a) molding a first material defining multiple electrical circuits;
   (b) over molding a second insulating material around portions of said first material;
   (c) applying an electrically conductive coating upon said circuits; and
   (d) conducting electricity from the power source to the distinctly separate electrical switches connected to said circuits.

25. The electrical harness of claim 24 further being made in accordance with the steps comprising:
   (a) integrally injection molding electrical connector blades as part of said circuits;
   (b) integrally injection molding stepped switch contacts as part of at least two of said circuits; and
   (c) substantially flexing said electrical harness in at least one direction prior to securing said electrical harness to an automotive vehicle panel.

26. The electrical harness of claim 24 further being made in accordance with the steps comprising fastening said electrical harness to an interior trim panel of said automotive vehicle by insert molding at least a portion of said electrical harness within a substrate of said interior trim panel.

* * * * *